United States Patent
Schenk et al.

(10) Patent No.: US 9,893,491 B2
(45) Date of Patent: Feb. 13, 2018

(54) MICROELECTROMECHANICAL SYSTEM FOR TUNING LASERS

(71) Applicant: Fraunhofer-Gesellschaft zur Foerderung der angewandten Forschung e.V., Munich (DE)

(72) Inventors: Harald Schenk, Dresden (DE); Jan Grahmann, Dresden (DE); Joachim Wagner, Freiburg-Hochdorf (DE); Ralf Ostendorf, Gundelfingen (DE); Marcel Rattunde, Gundelfingen (DE)

(73) Assignee: Fraunhofer-Gesellschaft zur Foerderung der angewandten Forschung e.V., Munich (DE)

( * ) Notice: Subject to any disclaimer, the term of this patent is extended or adjusted under 35 U.S.C. 154(b) by 0 days.

(21) Appl. No.: 15/223,768

(22) Filed: Jul. 29, 2016

(65) Prior Publication Data
US 2016/0336720 A1   Nov. 17, 2016

Related U.S. Application Data

(63) Continuation of application No. PCT/EP2015/051725, filed on Jan. 28, 2015.

(30) Foreign Application Priority Data

Jan. 30, 2014 (DE) .......... 10 2014 201 701

(51) Int. Cl.
*H01S 5/14* (2006.01)
*G01J 3/10* (2006.01)
(Continued)

(52) U.S. Cl.
CPC .............. *H01S 5/141* (2013.01); *G01J 3/108* (2013.01); *H01S 3/1055* (2013.01);
(Continued)

(58) Field of Classification Search
CPC ................ H01S 5/141; H01S 5/02252; B81B 2201/047
See application file for complete search history.

(56) References Cited

U.S. PATENT DOCUMENTS 7,116,481 B2   10/2006   Syms et al.
2005/0099665 A1   5/2005   Lee et al.

FOREIGN PATENT DOCUMENTS

DE   60206610 T2   5/2006
EP   2081265 A2   7/2009
(Continued)

OTHER PUBLICATIONS

Syms et al., "MOEMS Laser Tuning Element with an Indirect Drive," Optical MEMS and their applications Conference, Aug. 2005, pp. 11-12.*
(Continued)

*Primary Examiner* — Michael Carter
(74) *Attorney, Agent, or Firm* — Perkins Coie LLP; Michael A. Glenn

(57) ABSTRACT

A micromechanically produced optical device includes:
a carrier for carrying the micromechanically produced device;
a diffraction grating for diffracting light;
a plate for carrying the diffraction grating; and
deflectors for deflecting the plate in relation to the carrier, the deflectors comprising bearings for movably bearing the plate and a driver for moving the plate;
the deflectors being configured for rotational deflection of the plate and for translational deflection of the plate.

20 Claims, 11 Drawing Sheets

(51) Int. Cl.
    *H01S 3/1055*    (2006.01)
    *H01S 5/065*    (2006.01)
    *H01S 5/34*    (2006.01)
    *H01S 5/022*    (2006.01)

(52) U.S. Cl.
    CPC .......... *H01S 5/0654* (2013.01); *H01S 5/3401* (2013.01); *B81B 2201/047* (2013.01); *H01S 5/02252* (2013.01)

(56) References Cited

FOREIGN PATENT DOCUMENTS

| JP | 2005141229 A | 6/2005 |
|---|---|---|
| JP | 2006343481 A | 12/2006 |
| JP | 2007234916 A | 9/2007 |

OTHER PUBLICATIONS

Huang, W. et al., "Precision MEMS flexure mount for a Littmann tunable external cavity laser", IEE Proc-Sci. Meas. Technol.; vol. 151 No. 2, Mar. 2004, pp. 67-75.

Liu, Q. et al., "A Review of MEMS External-Cavity Turnable Lasers", J. Micromech. Microeng. 17, 2007, pp. R1-R13.

Liu, Q., "Tunable lasers using micromachined grating with continuous wavelength tuning", Applied Physics Letters; vol. 85, No. 17., Oct. 2004, pp. 3684-3686.

Syms, R.R.A. et al., "MOEMS Laser Tuning Element with an Indrirect Drive", Optical MEMS and their Applications Conference, Aug. 2005, pp. 11-12.

Zhou, Guangya et al., "High-Speed, High-Optical-Efficiency Laser Scanning Using a MEMS-Based In-Plane Vibratory Sub-Wavelength Diffraction Grating", J. Micromech. Microeng.; vol. 18; No. 8,Micro and Nano Systems Initiative, Department of Mechanical Engineering, National University of Singapore, Aug. 2008, pp. 1-11.

* cited by examiner

MICROELECTROMECHANICAL SYSTEM FOR TUNING LASERS

CROSS-REFERENCE TO RELATED APPLICATIONS

This application is a continuation of copending International Application No. PCT/EP2015/051725, filed Jan. 28, 2015, which is incorporated herein by reference in its entirety, and additionally claims priority from German Application No. DE 10 2014 201 701.7, filed Jan. 30, 2014, which is incorporated herein by reference in its entirety.

The present invention relates to systems for tuning lasers and to tunable lasers.

BACKGROUND OF THE INVENTION

In particular, the invention relates to tunable lasers for the mid infrared range (MIR). They may be used for spectroscopy, in particular. Examples: respiratory gas analysis ($CO_2$, nitrogen, etc.), foodstuff analysis (molds, protein content, fat content, etc.), environmental measurement engineering (fine dust, pollution by hydrocarbons, etc.), detection of explosives, process analytics in the chemical and pharmaceutical industries.

The wavelength of the laser is changed step by step or continuously. The emitted laser beam passes through the material to be analyzed (transmission/absorption spectroscopy) or is reflected by same (reflection spectroscopy). The intensity of the resulting signal is determined by means of a detector as a function of the wavelength. The spectrum thus obtained serves as a basis for determining the composition of the material examined.

Tuning has to be performed either continuously or quasi-continuously, i.e. in steps sufficiently small so that a suitably high spectral resolution is achieved. Otherwise, important absorption lines characteristic for the material would not be dissolved or not sufficiently dissolved, whereby identification would be made more difficult or be prevented.

Depending on the substance to be examined, specific wavelength sections within the MIR are of interest.

In this context, the requirement arises to provide a miniaturized, continuously tunable MIR laser source which can be flexibly adjusted to the wavelength range that may be used. Further requirements result from the necessity to also examine dynamic processes, which involves fast tunability, and from the necessity to achieve a high degree of optical coupling efficiency, which involves that the resonator be sealed off by a mirror or a diffraction grating having suitably large dimensions.

A first known approach relates to using light sources with broad-band emissions.

In the MIR, light sources with broad-band emissions such as a Globar, for example, which are combined with a wavelength-selective element for spectroscopy, have sometimes been employed. Such a wavelength-selective element provides a tunable Fabry-Perot filter, for example. Alternatively, the broad-band light sources are combined with a Fourier transformation spectrometer.

When using a Fabry-Perot filter one has to take care to ensure that the achievable resolution of the filter and the free spectral range are strictly correlated. The broad tuning range that may be used for achieving flexible applicability is consequently only achievable with a corresponding significant reduction of the resolution. In order to achieve both a broad tuning range and a high resolution, a combination of several filters having different free spectral ranges is useful, which increases complexity and manufacturing cost of the systems.

To achieve tunability, the filter and the highly reflecting mirror generally may be offset in relation to one another—or the array is rotated with regard to the incident beam. This actuation nowadays is mainly performed by precision-mechanically produced motors, e.g. stepper motors. Thus, the degree of miniaturization is clearly limited. Alternatively, MEMS Fabry-Perot filters (MEMS=microelectromechanical system) might be employed, e.g. by Axsun Technologies, however only for the near infrared range (NIR). In this context, a high degree of miniaturization is achieved. However, the MEMS-based production involves using selected layers for producing the highly reflecting Bragg reflectors. While typical combinations of highdiffraction and low-diffraction layers can easily be made available in MEMS technologies in the NIR, materials such as $CaF_2$ or other non-standard materials would be used in the MIR.

Due to the useful modulation of the optical path length, Fourier transformation spectrometers are generally slow and heavy and not portable since they are highly sensitive to vibrations. Even if first MEMS-based approaches are very promising in this area, the general problems that cooled detectors may be used for the MIR remains. Said detectors either have a very high electric power consumption (thermoelectric cooling module, Peltier element) or may be cooled by means of liquid nitrogen.

A further known approach relates to using light sources with narrow-band emission.

An alternative approach is the use of light sources with narrow-band emission, i.e. lasers, wherein the emitting wavelength may be changed by a suitable optical element. In the MIR, quantum cascade lasers have become widely accepted since other types of lasers actually do not cover this wavelength range. For tuning the emitted wavelength, wavelength-selective optical elements which limit the external laser cavity and/or are arranged within the external laser cavity are typically employed outside the laser chip.

As a first example of such an optical element, a Fabry-Perot filter is to be mentioned, which was already described above. FIG. 1 shows the fundamental arrangement with a quantum cascade laser chip, a lens for beam collimation, two tunable (Fabry Perot) filters and a highly reflecting mirror which seals off the external cavity. The first mirror of the cavity is formed by the side face of the laser diode (in FIG. 1, this is the left-hand side of the laser diode). To expand tunability, two Fabry-Perot filters have been cascaded, as was already described above.

Only those wavelengths which are transmitted by the two filters are amplified within the resonator and are thus emitted by the laser array. The fundamental disadvantages discussed above which result from using Fabry-Perot filters still remain.

An alternative approach is depicted in FIG. 2. Here, a diffraction grating is employed which performs the function of the Fabry-Perot filter and of the highly reflecting mirror.

The various wavelengths emitted by the laser chip impinge upon the diffraction grating. Depending on the grating period and the angle of incidence a, which may be varied by rotating the grating, in the first-order diffraction, only one wavelength is diffracted such that it moves back to the laser chip in a manner that is collinear with the incident beam. Said wavelength is amplified accordingly, so that the arrangement will emit at this wavelength. For this wavelength, the diffraction grating and the second highly reflecting mirror, which seals off the laser resonator, act as a Fabry-Perot filter. The filter and the wavelength diffracted back into the resonator by the diffracting grating may be tuned to each other. However, they change their properties as the angle of rotation of the grating changes in accordance with different angular functions. Thus, if the grating is rotated and if a different wavelength is thus diffracted back, the resonator length may be adapted to avoid mode hopping. The pivot point of the diffraction grating may be determined and adjusted individually for each configuration (grating period, central wavelength of the tuning range), so that a continuous tuning range is enabled. Simple flexible re-configuration would involve a pivot point that can be changed in a simple and automated manner. In technical solutions known today, mainly precision-mechanically produced motors are employed for rotating the diffraction grating, which motors may be re-mounted, however, in order to change the position of the pivot point. In addition to the lack of direct flexibility in terms of different wavelength ranges, miniaturization is not an option.

The variant shown in FIG. 3, wherein the diffraction grating is stationary, and a mirror is rotable instead, is very similar. By means of this so-called Littmann configuration one achieves that the resonator length—and, thus, the wavelength defined by the Fabry-Perot filter effect of the resonator—and the wavelength diffracted back by the tilting of the mirror change with the same angular function. A suitable pivot point is to be selected for this purpose, which may then remain stationary, however. This pivot point is typically located clearly outside the grating structure.

Examples of miniaturized architectures in MEMS technology for tunable laser sources within the visible range (VIS) and the NIR of up to 2 µm have been described, e.g., by A. Q. Liu et al. (A. Q. Liu et al.: "A review of MEMS external-cavity tunable lasers", J. Micromech. Microeng. 17 (2007), RI-R13, and A. Q. Liu et al.: "Tunable laser using micromachined grating with continuous wavelength tuning", Appl. Physics Letters, Vol. 85 (2004), pp. 3684-6). In one case, the grating and the electrostatic actuator for rotating the diffraction grating are produced by means of deep reactive ion etching (DRIE) in silicon. The diffraction grating has a restricted dimension in the vertical direction, which is due to the etching technique. Typical values here are 100 µm. As a result, the coupling efficiency is clearly restricted, especially in highly divergent laser diodes. Additional optical components such as cylinder lenses, for example, would be useful for achieving a high degree of efficiency. In deep reactive ion etching, the surface quality of the side walls is limited due to so-called scalloping (scoring caused by sequential etching and passivating in the DRIE process). This also has a negative effect on the coupling efficiency. Such an effect incidentally occurs in all DRIE etched structures, so that a mirror surface produced in this manner exhibits the same disadvantage. Finally, it is to be noted for the case of a diffraction grating etched by means of DRIE that the grating structure defined by the etching mask differs from the structure present at the surface to an increasing degree as the depth increases. This, too, has a negative effect on the grating quality and, thus, on the coupling efficiency.

The fundamental disadvantages of a DRIE etched structure also apply to the example given by W. Huang (W. Huang et al.: "Precision MEMS flexure mount for a Littman tunable external cavity laser", IEE Proc.-Sci. Meas. Technol. Vol 151(2) (2004), pp. 67-75). Here, a mirror that can be tilted via electrostatic actuators is described, the actuators and the mirror surface having been produced by means of DRIE. As a result of complex solid-body suspension and different actuators for tilting and translation, the virtual pivot point of the mirror may be located far off outside the chip, so that the chip can be kept small. Both movements, however, are not mutually independent and thus involve complex control. The achievable tilting angle of approx. 0.1° is relatively small but sufficient for a tuning range of +/−50 nm. The length of the mirror is 2.3 mm, the height is only 75 µm for the above-mentioned reasons.

In order to compensate for the small height of the DRIE mirror and/or of the DRIE diffraction grating, cylinder lenses are used, for example. The requirement placed upon the quality of the lenses and the expenditure for adjustment may be reduced as the dimension of the mirror and/or of the diffraction grating increases, which is why mirrors/diffraction gratings having lengths and heights clearly larger than 100 µm are advantageous. In addition, the grating structures that may be used for the MIR scale with the wavelength, which is why larger refraction gratings/mirrors may be used here than would be the case for the NIR.

A different approach to compensating for the change in the resonator length upon rotation of the grating in the Littrow configuration consists in using precision-mechanical piezoelectric actuators for translational displacement of the grating or of the resonator mirror.

SUMMARY

According to an embodiment, a micromechanically produced optical device may have: a carrier for carrying the micromechanically produced device; a diffraction grating for diffracting light; a plate for carrying the diffraction grating; and deflectors for deflecting the plate in relation to the carrier, the deflectors including bearings for movably bearing the plate and a driver for moving the plate; the deflectors being configured for rotational deflection of the plate and for translational deflection of the plate; wherein the driver is an electrostatic driver which includes at least one electrode arrangement and a controller for applying a control voltage to the at least one electrode arrangement; wherein the bearings include an intermediate frame movably connected to the carrier and to the plate, respectively; wherein the driver includes at least one first electrode arrangement for deflecting the intermediate carrier in relation to the carrier, and at least one second electrode arrangement for deflecting the plate in relation to the intermediate carrier; and wherein the at least one first electrode arrangement for deflecting the intermediate carrier in relation to the carrier includes at least one electrode that is stationary on the intermediate carrier and at least one electrode that is stationary on the carrier, and wherein the at least one second electrode arrangement for deflecting the plate in relation to the intermediate carrier includes at least one electrode that is stationary on the intermediate carrier and at least one electrode that is stationary on the plate.

According to another embodiment, a laser for generating a laser beam having a variable wavelength may have a laser resonator determining the wavelength, the laser resonator including a micromechanically produced optical device as claimed in claim 1 with which the wavelength can be varied.

By using MEMS technology, the diffraction grating can be produced with a high optical quality and with large dimensions. Dimensions of several millimeters are readily possible. The diffraction grating may be produced, in particular, by means of layer deposition or structuring.

The diffraction grating thus produced therefore differs significantly from the above-described optical surfaces produced my means of DRIE.

Rotation about a very distant pivot point may be realized by suitably combining rotation and translation of the plate on which the diffraction grating is arranged. In this manner, a laser may be tuned without any mode hopping.

The inventive device thus unites the advantages of the simplicity of the architecture, of the high optical quality as well as of operation that is free from mode hopping.

In accordance with an advantageous further development of the invention, the diffraction grating is configured for diffracting light within the mid infrared range. In this manner it is possible to tune a laser working within the mid infrared range. The mid infrared range concerns the wavelengths within the range from 2.5-25 µm.

In accordance with a convenient further development of the invention, the bearing means include elastically deformable bearing elements. Such bearing elements enable sufficient movability of the plate and may be produced in a simple and precise manner by means of MEMS technologies.

In accordance with an advantageous further embodiment of the invention, the plate has a position sensor associated with it which is configured to measure the rotational deflection and/or to measure the translational deflection of the plate. As a result it is possible to perform not only open-loop control, but also closed-loop control of the movement of the plate, which may have a positive effect on the precision of the rotational deflection and/or the translational deflection of the plate.

In accordance with an advantageous further development of the invention, the drive means is an electrostatic drive means which includes at least one electrode arrangement and a control means for applying a control voltage to the at least one electrode arrangement. An electrostatic drive means is based on the mutual electrostatic attraction of differently charged electrodes and/or on the mutual electrostatic rejection of electrodes of the same kind. An electrode arrangement is understood to mean an arrangement of electrodes which may be in direct electrostatic interaction with one another provided that they have a charge-generating control voltage applied to them. Such electrode arrangements may be produced in a simple and miniaturized manner by means of MEMS technologies.

In accordance with a convenient further development of the invention, at least one of the electrode arrangements is an electrode arrangement for translational deflection and for rotational deflection of the plate. This results in a simple architecture of the device.

In accordance with an advantageous further development of the invention, the electrostatic drive means includes at least electrode arrangement for exclusively translational deflection of the plate and a second electrode arrangement for exclusively rotational deflection of the plate. In this manner, the translational deflection of the plate may be effected independently of the rotational deflection of the plate, which may have a positive effect on the accuracy of the deflection.

In accordance with a convenient further development of the invention, the electrostatic drive means is configured such that the translational deflection of the plate is effected in a quasi-static manner.

In accordance with an advantageous further development of the invention, the electrostatic drive means is configured such that the rotational deflection of the plate is effected in a quasi-static manner.

A quasi-static deflection is understood to mean a deflection wherein each instantaneous value of the deflection can be unambiguously associated with a value of the control voltage. In other words: one speaks of a quality-static deflection when the instantaneous value of the deflection changes in a manner that is synchronous with the control voltage. In the event of a quasi-static deflection, the tuning of the laser may be performed in almost any pattern. For example, zigzag patterns or sinusoidal patterns are possible.

In accordance with an expedient further development of the invention, the electrostatic drive means is configured such that the translational deflection of the plate is effected by resonant excitation.

In accordance with an expedient further development of the invention, the electrostatic drive means is configured such that the rotational deflection of the plate is effected by resonant excitation.

This is understood to mean that the plate is made to resonate in a rotational and/or translational manner. As a result, large deflections may be achieved with small forces and/or control voltages. However, only sinusoidal deflections are possible in this manner.

In accordance with an advantageous further development of the invention, the bearing means include elastically deformable bearing elements which connect the carrier and the plate. The direct elastic connection of the carrier and the plate simplify the architecture of the device.

In accordance with an advantageous further development of the invention, the at least one electrode arrangement includes at least one electrode that is stationary on the carrier and at least one electrode that is stationary on the plate. This feature, too, has a positive effect on the simplicity of the architecture of the device.

In accordance with an advantageous further development of the invention, the bearing means include an intermediate frame which is movably connected to the carrier and the plate, respectively. Such an intermediate frame enables constructively separating the translational deflection and the rotational deflection of the plate from each other. This has a positive effect on precision.

In accordance with an expedient further development of the invention, the bearing means include at least one elastically deformable bearing element connecting the intermediate carrier and the plate, and at least one second elastically deformable bearing element connecting the intermediate carrier and the carrier. This results in a simple architecture of the device.

In accordance with an expedient further development of the invention, the drive means comprise at least one first electrode arrangement for deflecting the intermediate carrier in relation to the carrier and at least one second electrode arrangement for deflecting the plate in relation to the intermediate carrier. This, too, has a positive effect on the simplicity of the architecture of the device.

In accordance with an expedient further development of the invention, the at least one first electrode arrangement for deflecting the intermediate carrier in relation to the carrier comprises at least one electrode that is stationary on the intermediate carrier and at least one electrode that is stationary on the carrier, and the at least one second electrode arrangement for deflecting the plate in relation to the intermediate carrier comprises at least one electrode that is stationary on the intermediate carrier and at least one electrode that is stationary on the plate.

In accordance with an expedient further development of the invention, the bearing means is configured for translational deflection of the intermediate carrier in relation to the carrier and for rotational deflection of the plate in relation to the intermediate carrier.

In accordance with an expedient further development of the invention, the bearing means is configured for rotational deflection of the intermediate carrier in relation to the carrier and for translational deflection of the plate in relation to the intermediate carrier.

In this manner, the rotational deflection and the translational deflection of the plate can be fully decoupled from each other.

The invention further provides a laser for generating a laser beam having a variable wavelength with a laser resonator determining the wavelength, the laser resonator comprising a micromechanically produced optical device as claimed in any of the previous claims with which the wavelength can be varied. The above-described advantages result.

In accordance with an expedient further development of the invention, the laser is a semiconductor laser.

In accordance with an advantageous further development of the invention, the laser is a quantum cascade laser.

In accordance with an advantageous further development of the invention, the laser is configured to generate the laser beam within the mid infrared range.

In accordance with an expedient further development of the invention, the polarization of the diffraction grating is aimed at maximizing a feedback efficiency into an active medium of the laser.

The advantageous implementations and further developments of the invention discussed above and/or indicated in the sub claims may be employed individually or in any combination, except, e.g., in cases of unambiguous dependencies or incompatible alternatives.

BRIEF DESCRIPTION OF THE DRAWINGS

Embodiments of the present invention will be detailed subsequently referring to the appended drawings, in which.

DETAILED DESCRIPTION OF THE INVENTION

Figure 4:
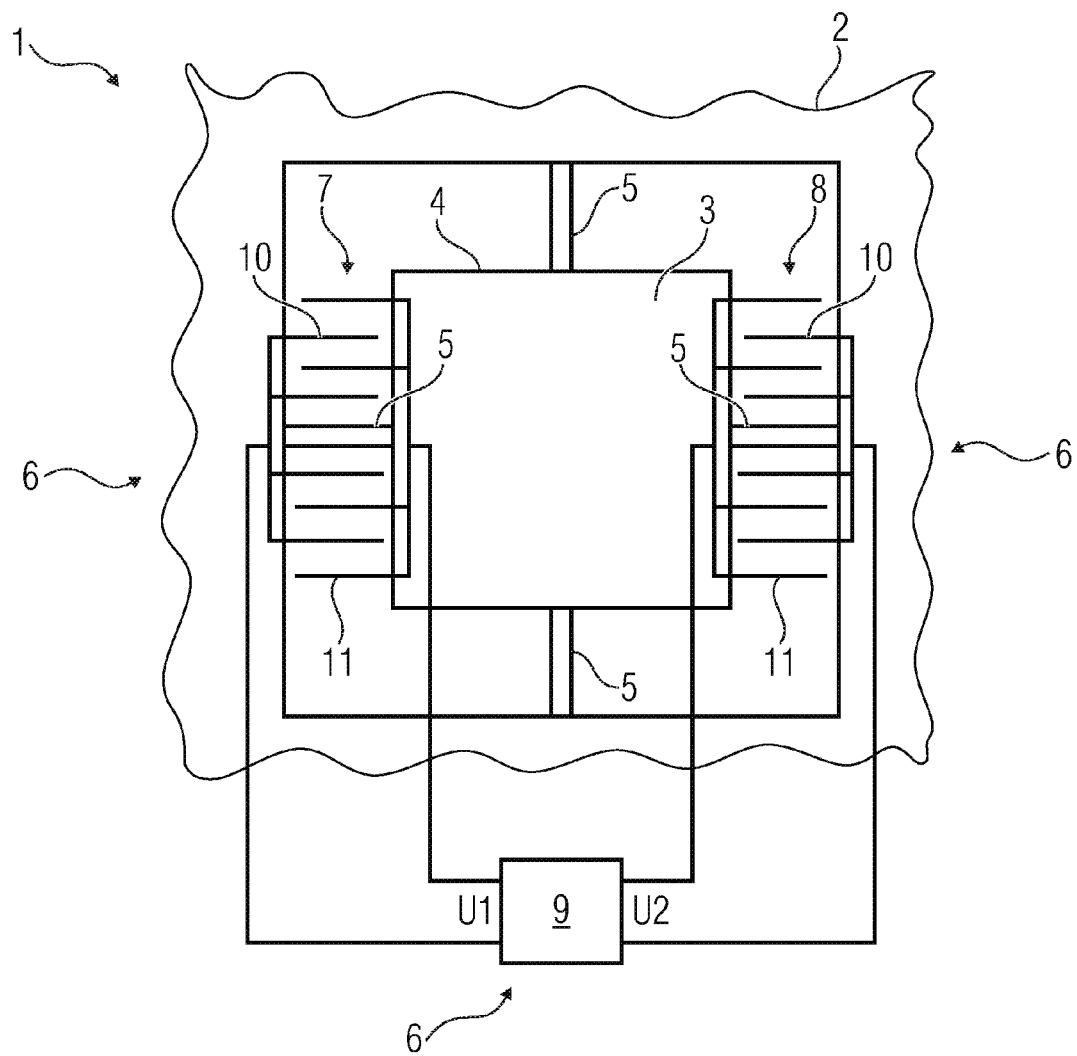
FIG. 4 a first advantageous embodiment of an inventive device in a top view.
Figure 5:
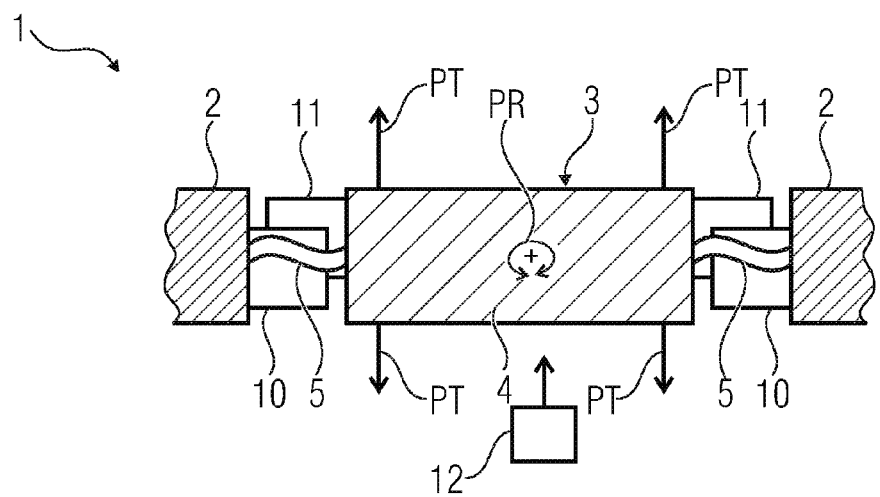
FIG. 5 the first advantageous embodiment of an inventive device in a cut side view.

FIG. 4 shows a first advantageous embodiment of an inventive device in a top view, and FIG. 5 shows the first advantageous embodiment of an inventive device in a cut side view.

FIGS. 4 and 5 show a micromechanically produced optical device 1 including:

a carrier 2 for carrying the micromechanically produced device 1;

a diffraction grating 3 for diffracting light;

a plate 4 for carrying the diffraction grating 3; and deflection means 5, 6; 6, 18, 19 for deflecting PT, PR the plate 4 in relation to the carrier 2, the deflection means 5, 6; 6, 17, 18, 19 comprising bearing means 5; 17, 18, 19 for movably bearing the plate 4 and drive means 6 for moving the plate 4;

the deflection means 5, 6; 6, 17, 18, 19 being configured for rotational deflection PR of the plate 4 and for translational deflection PT of the plate 4.

By using MEMS technology, the diffraction grating 3 can be produced with a high optical quality and with large dimensions. Dimensions of several millimeters are readily possible. The diffraction grating 3 may be produced, in particular, by means of layer deposition or structuring. The diffraction grating 3 thus produced therefore differs significantly from the above-described optical surfaces produced my means of DRIE.

Rotation about a very distant pivot point may be realized by suitably combining rotation and translation of the plate 4 on which the diffraction grating 3 is arranged. In this manner, a laser may be tuned without any mode hopping.

The inventive device thus unites the advantages of the simplicity of the architecture, of the high optical quality as well as of operation that is free from mode hopping.

In accordance with an advantageous further development of the invention, the diffraction grating 3 is configured for diffracting light within the mid infrared range. In this manner it is possible to tune a laser working within the mid infrared range. The mid infrared range concerns the wavelengths within the range from 2.5-25 μm.

In accordance with a convenient further development of the invention, the bearing means 5 include elastically deformable bearing elements 5. Such bearing elements 5 enable sufficient movability of the plate 4 and may be produced in a simple and precise manner by means of MEMS technologies.

In accordance with an advantageous further embodiment of the invention, the plate 4 has a position sensor 12 associated with it which is configured to measure the rotational deflection PR and/or to measure the translational deflection PT of the plate 4. As a result it is possible to perform not only open-loop control, but also closed-loop control of the movement of the plate 4, which may have a positive effect on the precision of the rotational deflection PR and/or the translational deflection PT of the plate 4.

In accordance with an advantageous further development of the invention, the drive means 6 is an electrostatic drive means 6 which includes at least one electrode arrangement 7, 8 and a control means 9 for applying a control voltage U1, U2 to the at least one electrode arrangement 7, 8. An electrostatic drive means 6 is based on the mutual electrostatic attraction of differently charged electrodes 10, 11 and/or on the mutual electrostatic rejection of electrodes of the same kind. An electrode arrangement 7, 8 is understood to mean an arrangement of electrodes 10, 11 which may be in direct electrostatic interaction with one another provided that they have a charge-generating control voltage U1, U2 applied to them. Such electrode arrangements 7, 8 may be produced in a simple and miniaturized manner by means of MEMS technologies.

In accordance with a convenient further development of the invention, at least one of the electrode arrangements 7, 8 is an electrode arrangement 7, 8 for translational deflection PT and for rotational deflection PR of the plate. This results in a simple architecture of the device. In the first embodiment, the electrode arrangement 7 has a first control voltage U1 supplied to it, whereas the electrode arrangement 8 has a control voltage U2 supplied to it which is independent of the first control voltage U1. A translational deflection PT may be achieved, for example, in the quasi-stationary case, in that U1 and U2 correspond to each other over time. A rotational deflection PR, however, can be effected, for example in the quasi-stationary case, in that U1 and U2 adopt different values over time.

In accordance with an advantageous further development of the invention, the bearing means include elastically deformable bearing elements 5 which connect the carrier 2 and the plate 4. The direct elastic connection of the carrier 2 and the plate 4 simplify the architecture of the device.

In accordance with an advantageous further development of the invention, the at least one electrode arrangement 7, 8 includes at least one electrode 10 that is stationary on the carrier and at least one electrode 11 that is stationary on the plate. This feature, too, has a positive effect on the simplicity of the architecture of the device.

Figure 6:
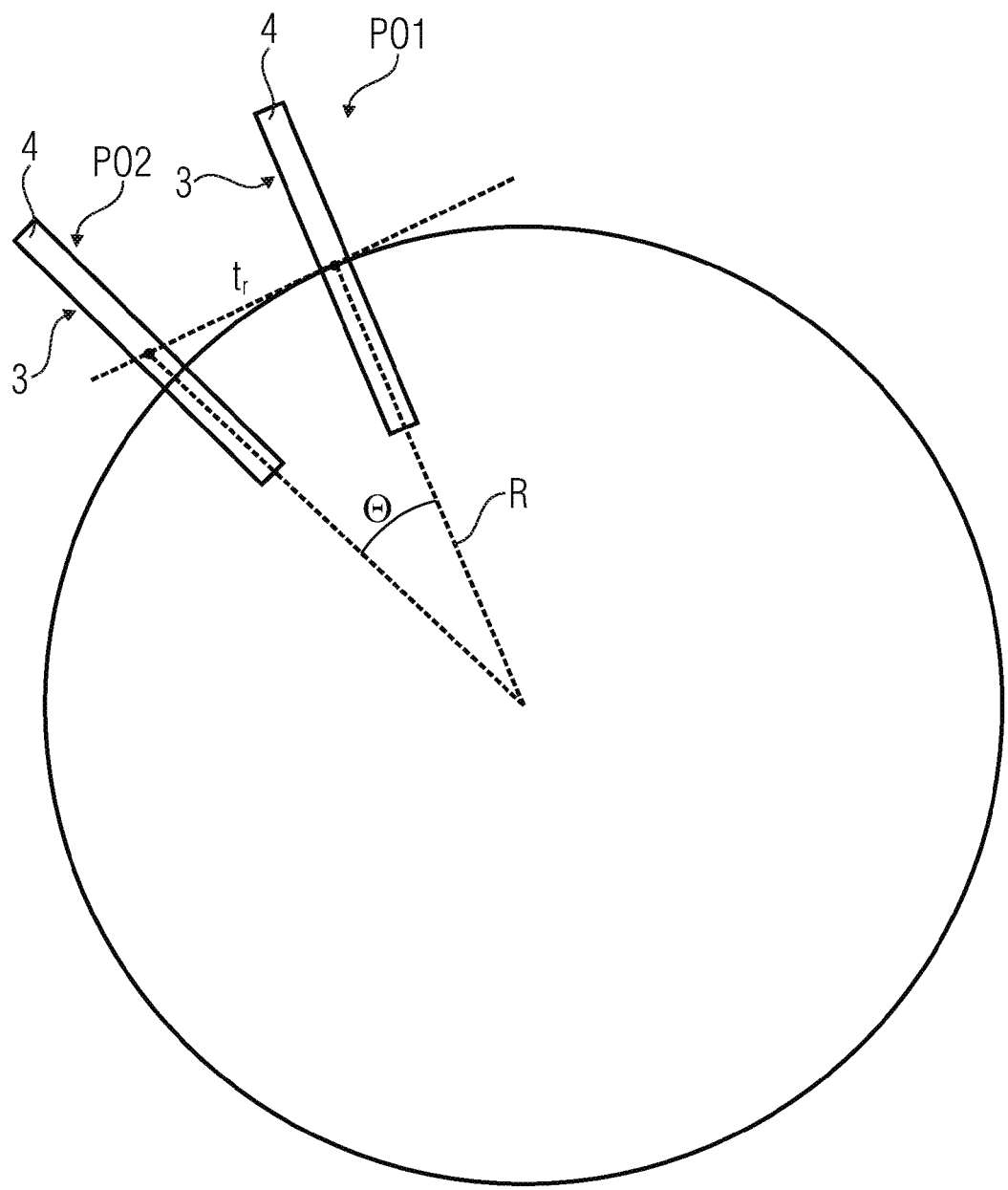
FIG. 6 an outline for illustrating the deflection of the plate of an inventive device.

FIG. 6 shows an outline for illustrating the deflection of the plate of an inventive device. FIG. 6 illustrates how rotation about a distant pivot point may be realized by suitably combining rotational deflection and translational deflection of the plate 4, which supports the diffraction grating 3. FIG. 6 shows two positions PO1 and PO2 of the plate 4 during deflection. In the first position PO1, the plate 4 is not tilted and not translationally deflected. In the position PO2, the plate 4 is tilted by the angle θ while being translationally displaced by the distances $t_r$ such that a rotation of the plate 4 about a remote pivot point results, said pivot point representing the center of the drawn circle having the radius R.

If the timeline of the angle of rotation θ(t) is predefined due to the resonant torsional vibration of the plate 4, the simple geometric relationship $$t_r(t) = R \times \tan \theta(t) \qquad \text{Equation 1:}$$

results in the useful translational deflection made available by the translational drive, which is quasi-static, for example.

Figure 1:
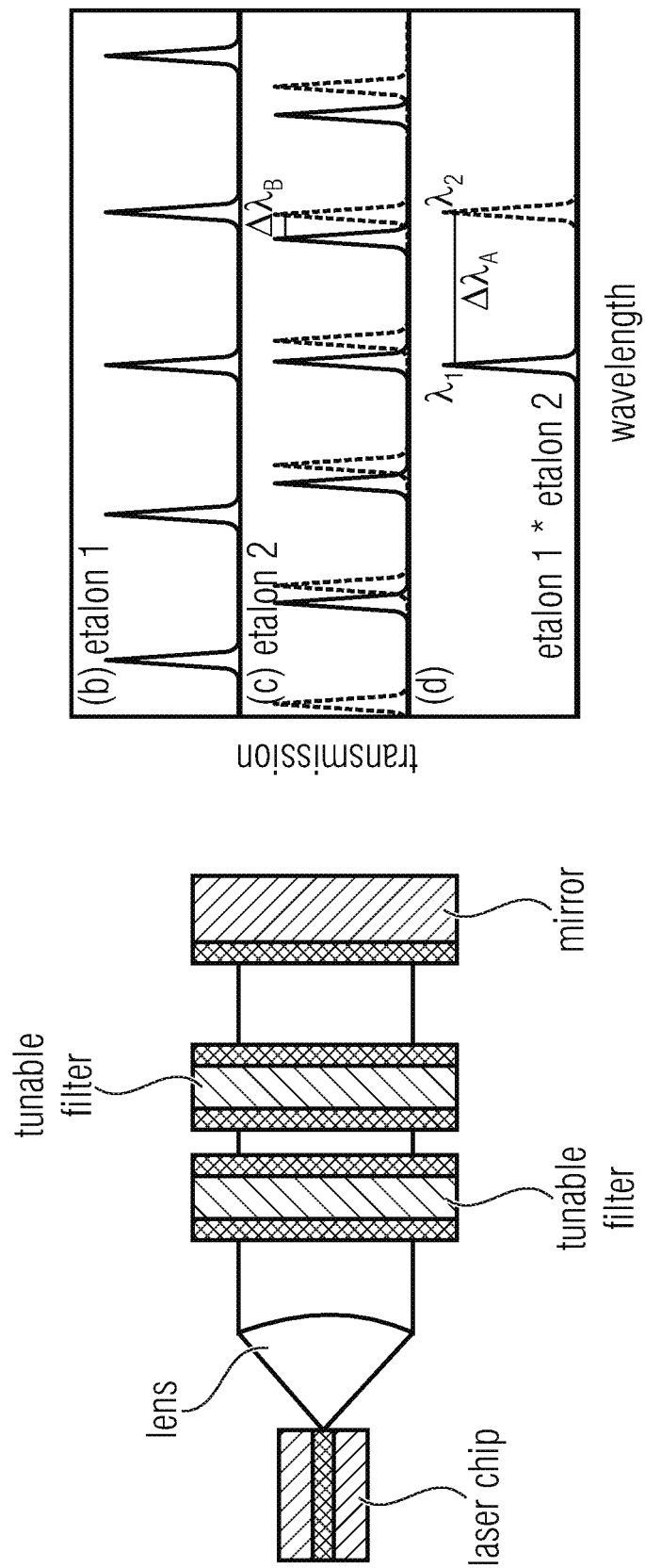
FIG. 1 a first tunable laser in accordance with conventional technology.
Figure 2:
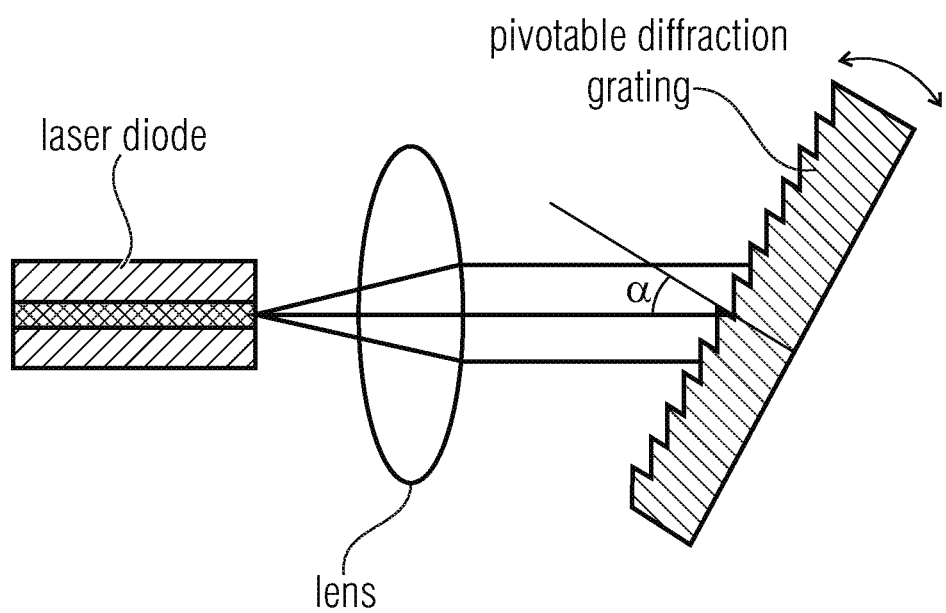
FIG. 2 a second tunable laser in accordance with conventional technology.
Figure 3:
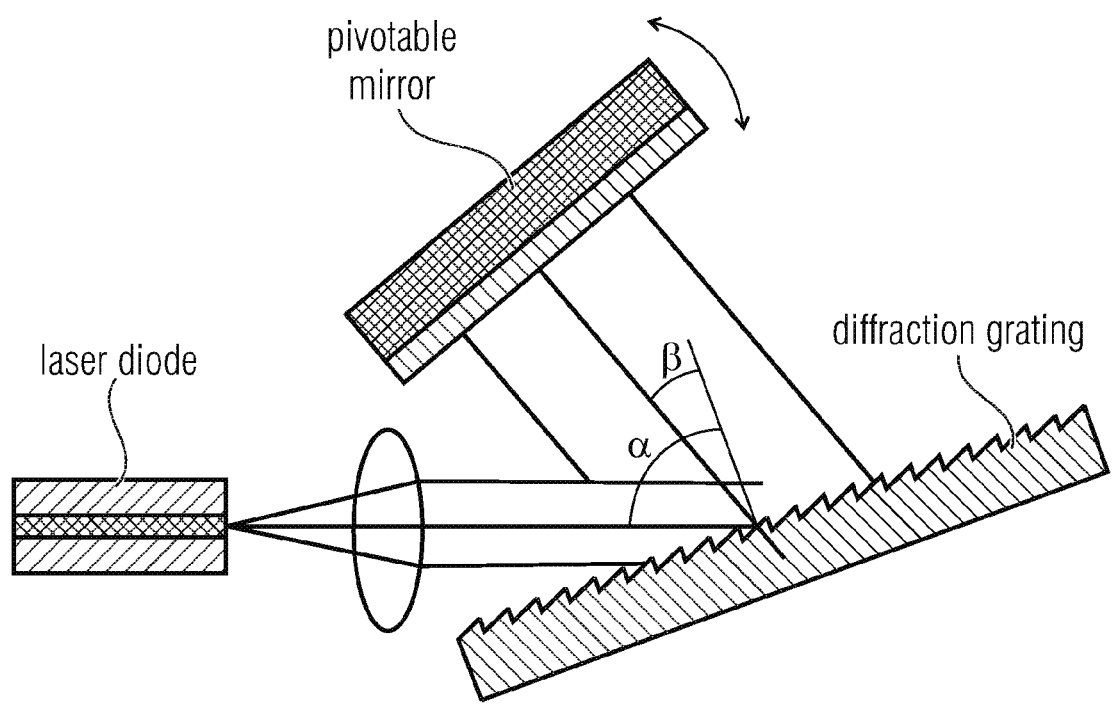
FIG. 3 a third tunable laser in accordance with conventional technology.

Operation of the device 1 in accordance with equation 1 thus enables combining the advantages of the Littrow configuration (simple architecture, cf. FIG. 2) with the advantages of the Littmann configuration (laser operation that is free from mode hopping by implementing a pivot point located outside the arrangement, cf. FIG. 3).

A specific case is operation at small rotational angles. For small values, the tangent may be replaced by its argument. Equation 1 will then approximately result in the following:

$$t_r(t) = R \times \tan \theta(t) \qquad \text{Equation 2:}$$

This means that the translation may follow the same timeline as does the rotation. In the event of resonant operation of rotation, the translation may therefore also be excited in a resonant manner. This has considerable advantages particularly for the achievable frequency at which the tuning may be performed. A quasi-static drive is restricted to lower frequencies since higher frequencies involve forces that cannot be made available by MEMS devices. In the event of resonant operation, however, the quality factor is exploited, so that operation with a sufficient amplitude is enabled also at frequencies within the range of several kHz. The power consumption of resonantly operated systems is correspondingly lower. Also, the requirements placed upon control electronics and positional readout are clearly lower during resonant operation than with quasi-static control.

A further case results for a non-constant radius R. If in a Littrow configuration, for example, a change in the pivot point becomes useful during the rotation of the diffraction grating for a broad tunable range, this may be achieved, in accordance with equation 1, by adapting the timeline of the translation accordingly when the progress of the rotation is predefined. To this end, an angular dependence of the radius is to be taken into account, which is translated into a time dependency:

$$t_r(t) = R(\theta(t)) \times \tan \theta(t) \qquad \text{Equation 3:}$$

If the rotatory axis is deflectable in a quasi-static manner, each included wavelength range may be passed through within the maximum tunable wavelength range Δmax=λ1 to λ2 without having to pass through the entire maximum tuning range. For example, if the characteristic wavelength range for identifying a substance is known and smaller than Δmax, a temporal advantage with result therefrom particularly with multiple measurements for averaging. Also, it is made possible that with unknown substances, a measurement is initially performed with a small number N for averaging so as to identify the characteristic wavelength ranges, and subsequently a plurality of further measurements—for increasing the signal/noise ratio—is performed in the characteristic wavelength ranges.

Figure 7:
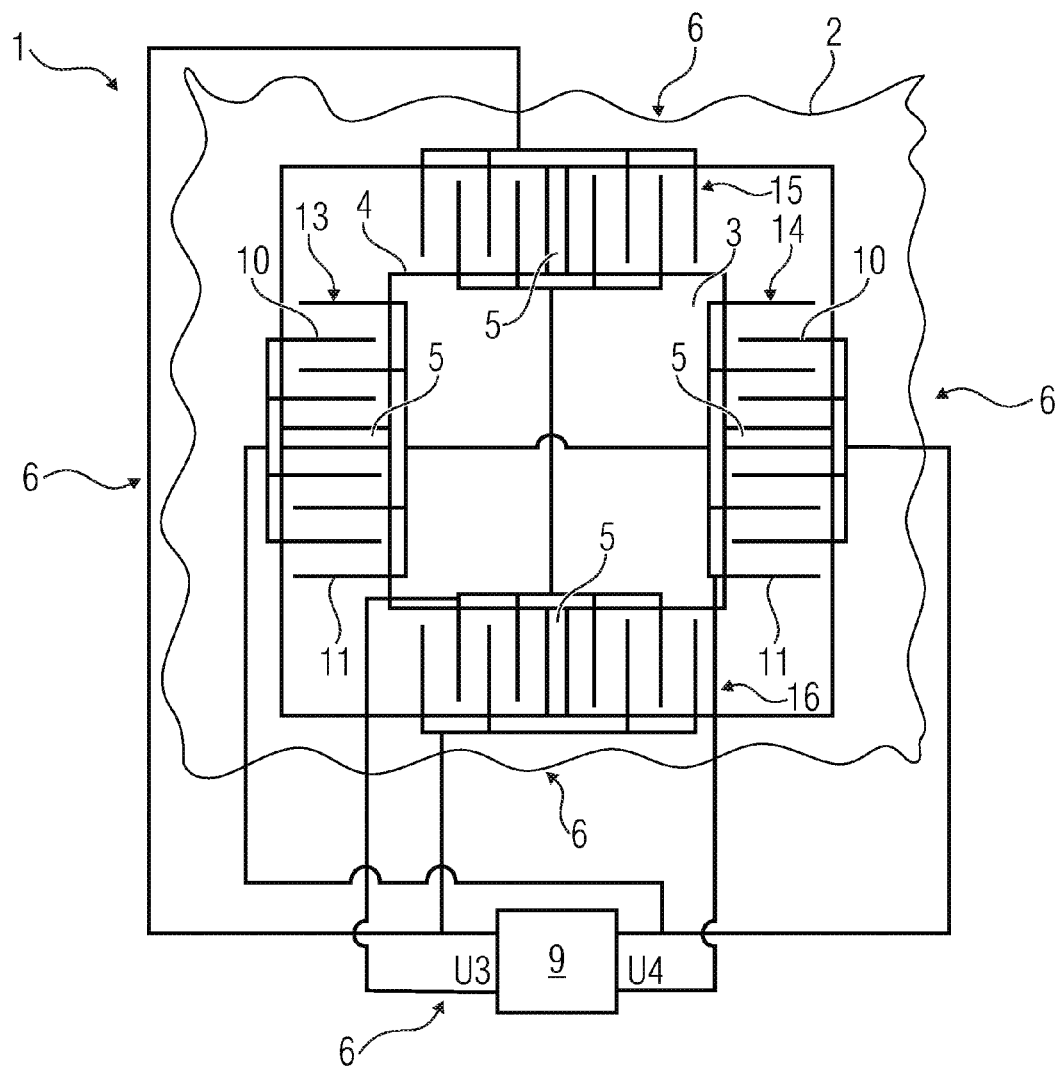
FIG. 7 a second advantageous embodiment of an inventive device in a top view.
Figure 8:
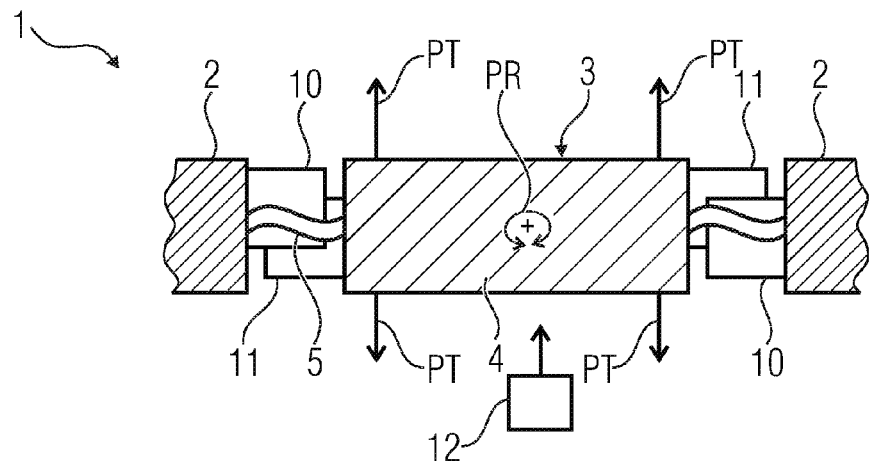
FIG. 8 the second advantageous embodiment of an inventive device in a cut side view.

FIG. 7 shows a further advantageous embodiment of an inventive device 1 in a top view, and FIG. 8 shows the second advantageous embodiment of an inventive device 1 in a cut side view. The second embodiment is based on the first embodiment; in the following, only the differences will be explained.

In accordance with an advantageous further development of the invention, the electrostatic drive means 6 includes at least one first electrode arrangement 13, 14 for exclusively translational deflection PT of the plate 4 and a second electrode arrangement 15, 16 for exclusively rotational deflection PR of the plate 4. In this manner, the translational deflection of the plate may be caused independently of the rotational deflection of the plate, which may have a positive effect on the accuracy of the deflection. In the second embodiment, the first electrode arrangements 13 and 14 have the control voltage U3 applied to them, and the second electrode arrangements 15 and 16 have the control voltage U4, which is independent of the former, applied to them.

Figure 9:
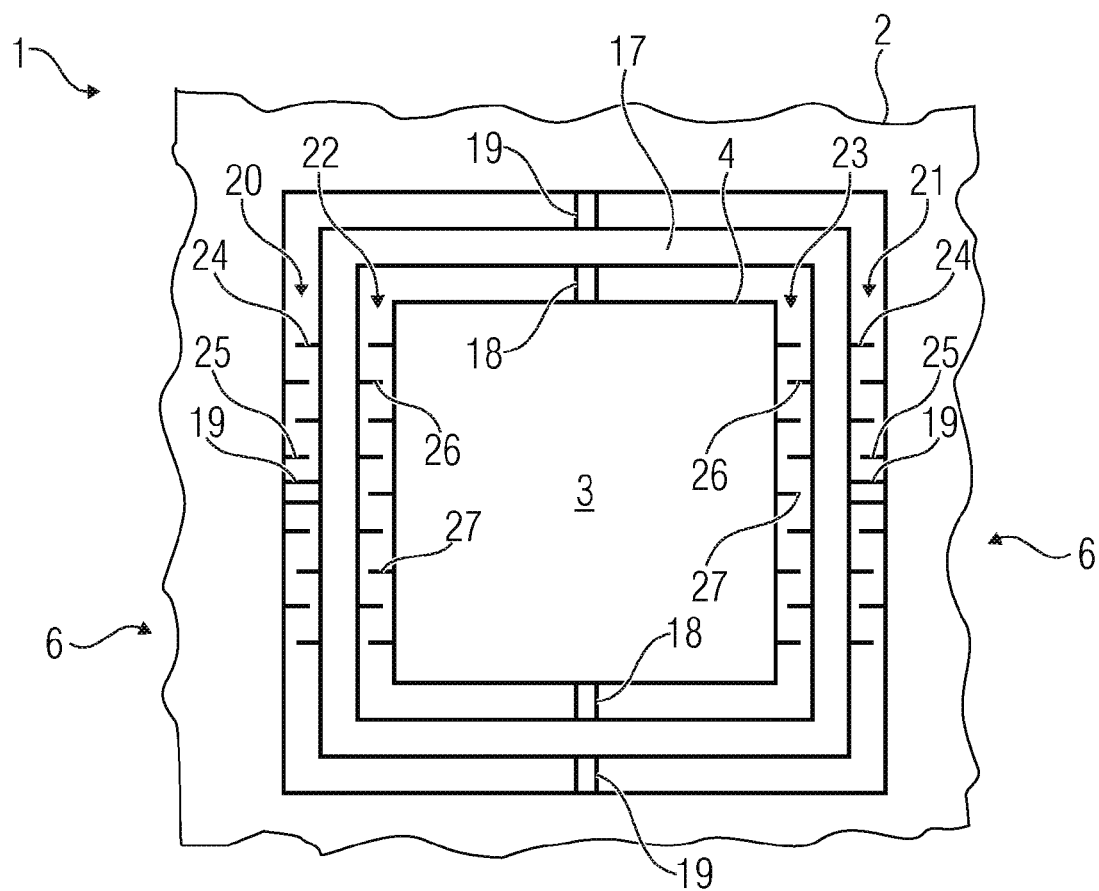
FIG. 9 a third advantageous embodiment of an inventive device in a top view.
Figure 10:
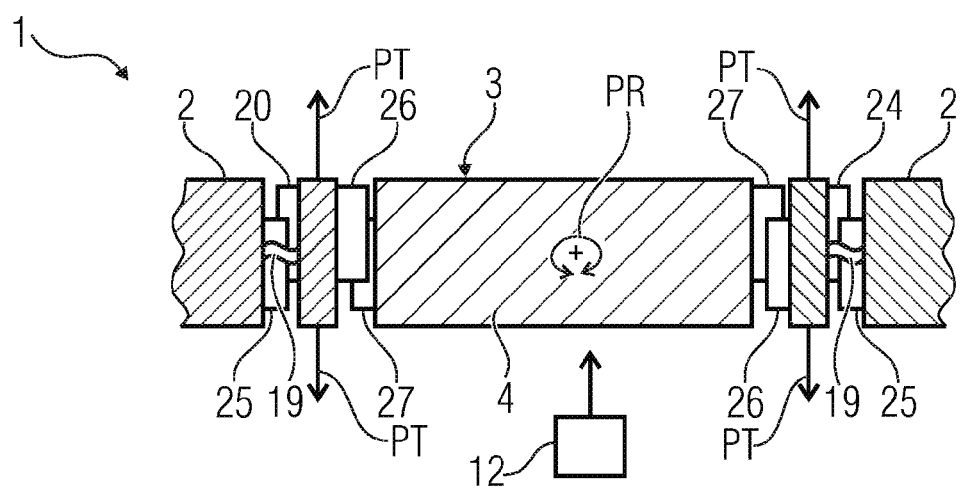
FIG. 10 the third advantageous embodiment of an inventive device in a cut side view.

FIG. 9 shows a third advantageous embodiment of an inventive device in a top view, and FIG. 10 shows the third advantageous embodiment of an inventive device in a cut side view. The third advantageous embodiment is also based on the first embodiment, so that here, too, only the corresponding differences will be explained. For reasons of clarity, the control means 9 is omitted here.

In accordance with an advantageous further development of the invention, the bearing means 17, 18, 19 include an intermediate frame 17 which is movably connected to the carrier 2 and the plate 4, respectively. Such an intermediate frame 17 enables constructively separating the translational deflection PT and the rotational deflection PR of the plate 4 from each other. This has a positive effect on precision.

In accordance with an expedient further development of the invention, the bearing means include at least one elastically deformable bearing element 18 connecting the intermediate carrier 17 and the plate 4, and at least one second elastically deformable bearing element 19 connecting the intermediate carrier 17 and the carrier 2. This results in a simple architecture of the device 1.

In accordance with an expedient further development of the invention, the drive means comprise at least one first electrode arrangement 20, 21 for deflecting the intermediate carrier 17 in relation to the carrier 2 and at least one second electrode arrangement 22, 23 for deflecting the plate 4 in relation to the intermediate carrier 17. This, too, has a positive effect on the simplicity of the architecture of the device.

In accordance with an expedient further development of the invention, the at least one first electrode arrangement 20, 21 for deflecting the intermediate carrier 17 in relation to the carrier 2 comprises at least one electrode 24 that is stationary on the intermediate carrier and at least one electrode 25 that is stationary on the carrier, and the at least one second electrode arrangement 22, 23 for deflecting the plate 4 in relation to the intermediate carrier 17 comprises at least one electrode 26 that is stationary on the intermediate carrier and at least one electrode 27 that is stationary on the plate.

In accordance with an expedient further development of the invention, the bearing means 17, 18, 19 are configured for translational deflection PT of the intermediate carrier 17 in relation to the carrier 2 and for rotational deflection PR of the plate 4 in relation to the intermediate carrier 17.

Figure 11:
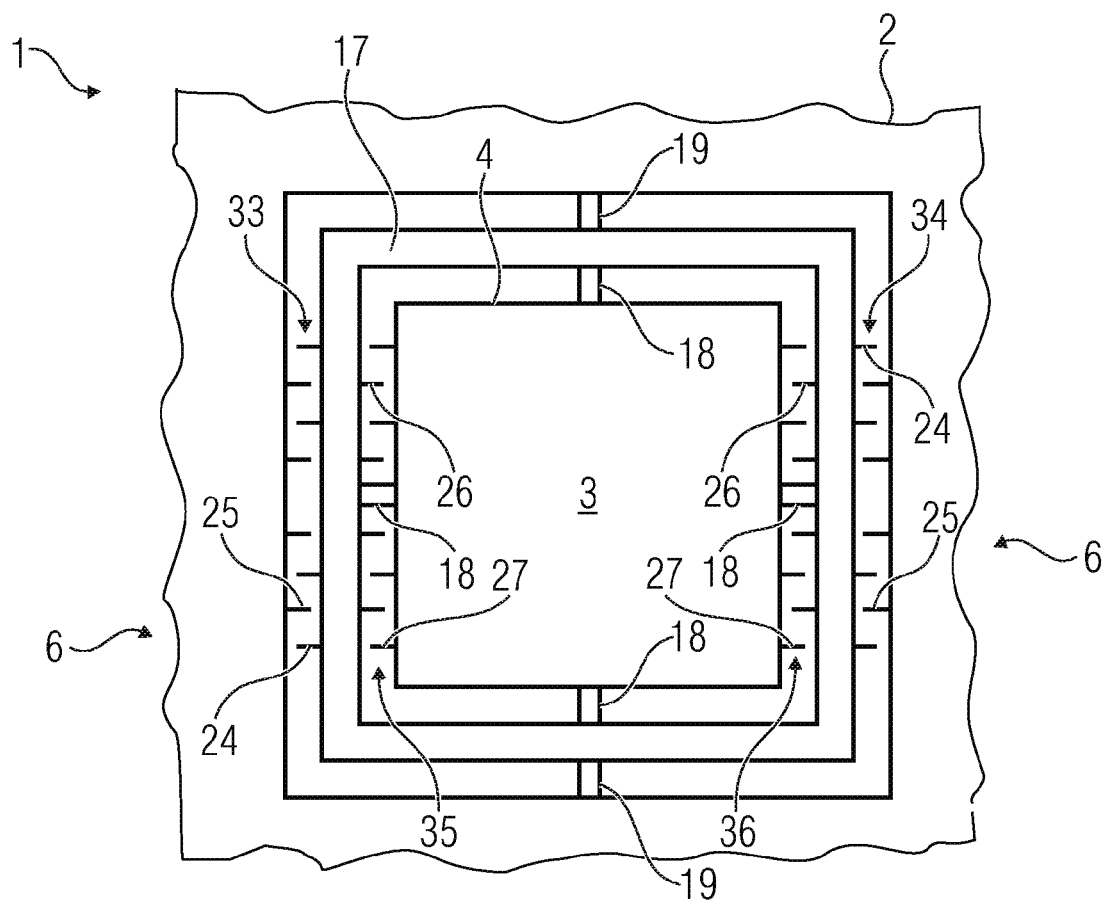
FIG. 11 a fourth advantageous embodiment of an inventive device in a top view.
Figure 12:
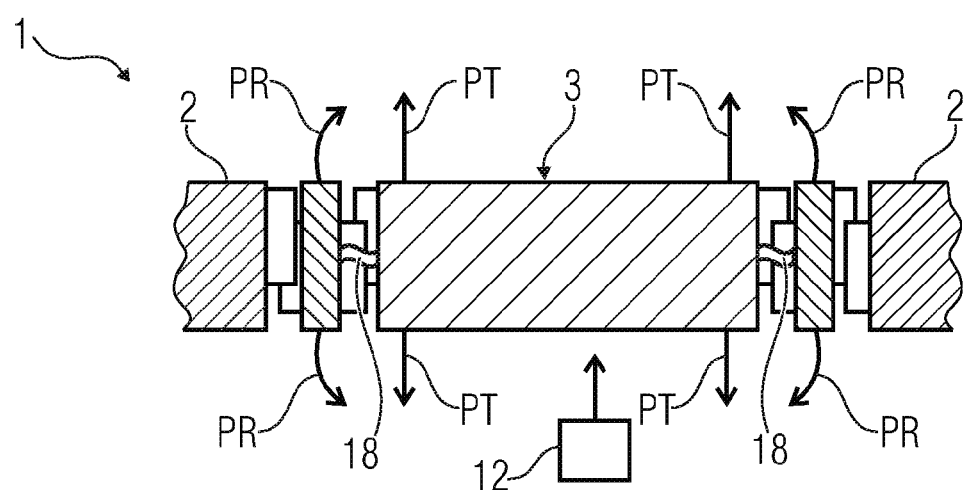
FIG. 12 the fourth advantageous embodiment of an inventive device in a cut side view.

FIG. 11 shows a fourth advantageous embodiment of an inventive device in a top view, and FIG. 12 shows the fourth advantageous embodiment of an inventive device in a cut side view. The fourth embodiment is based on the third embodiment. Therefore, only the differences between both embodiments will be explained below.

In accordance with an expedient further development of the invention, the bearing means for rotational deflection PR of the intermediate carrier 17 in relation to the carrier 2 and for translational deflection of the plate 3 in relation to the intermediate carrier 17 are now configured. In this context, the electrode arrangements 33 and 34 are provided for rotational deflection PR of the intermediate carrier 17 and the electrode arrangements 35 and 36 are provided for translational deflection of the plate 3 in relation to the intermediate carrier 17.

Figure 13:
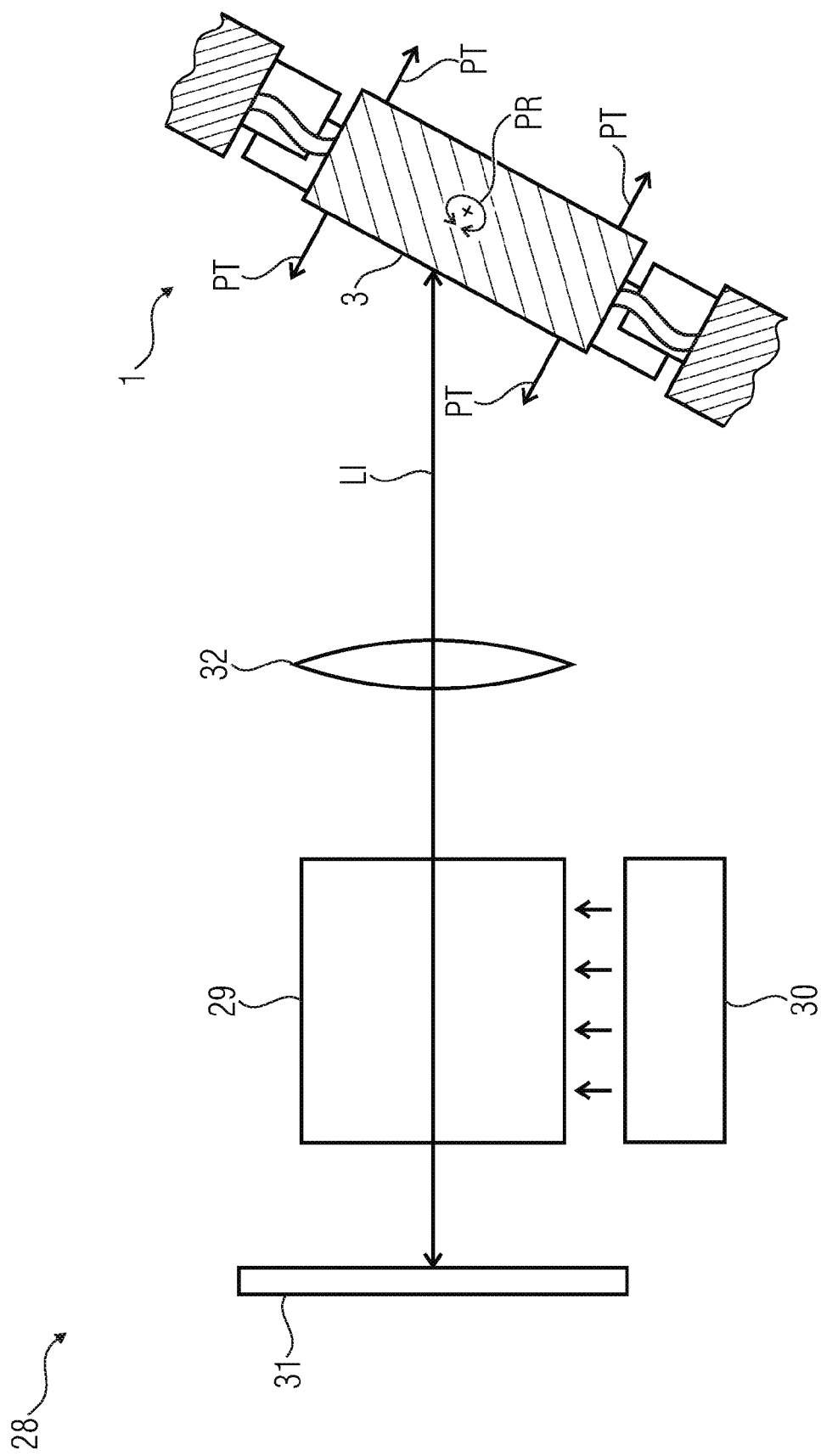
FIG. 13 an embodiment of an inventive laser.

FIG. 13 shows an embodiment of an inventive laser 28. The laser 28 for generating a laser beam LI having a variable wavelength comprises a laser resonator 1, 31 determining the wavelength, the laser resonator 1, 31 comprising a micromechanically produced optical device 1 having a diffraction grating 3 of the above-described type with which the wavelength can be varied. In a known manner, the laser 28 includes an active medium 29 and a pump 30. In a manner that is also known, a lens 32 is provided between the active medium 29 and the diffraction grating 3. The above-described advantages result.

In accordance with a convenient further development of the invention, the laser 28 is a semiconductor laser 28.

In accordance with an advantageous further development of the invention, the laser 28 is a quantum cascade laser 28.

In accordance with an advantageous further development of the invention, the laser 28 is configured to generate the laser beam LI within the mid infrared range.

In accordance with an expedient further development of the invention, the polarization of the diffraction grating 3 is aimed at maximizing a feedback efficiency into an active medium 29 of the laser 28.

Figure 14:
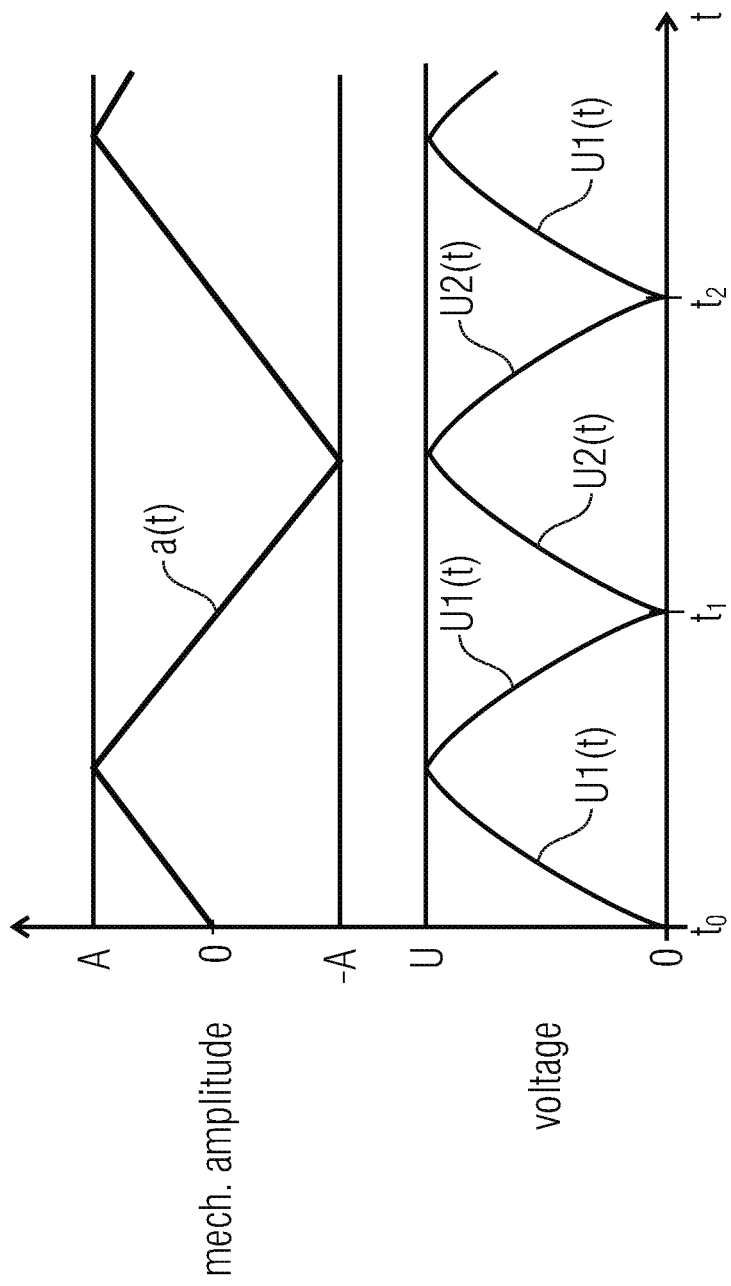
FIG. 14 an outline for illustrating a quasi-static deflection.

FIG. 14 shows an outline for illustrating a quasi-static deflection.

In accordance with a convenient further development of the invention, the electrostatic drive means 6 is configured such that the translational deflection PT of the plate 4 is effected in a quasi-static manner.

In accordance with an advantageous further development of the invention, the electrostatic drive means 6 is configured such that the rotational deflection PR of the plate 4 is effected in a quasi-static manner.

A quasi-static deflection is understood to mean a deflection wherein each instantaneous value a(t) of the deflection can be unambiguously associated with a value U(t) of the control voltage U. In other words: one speaks of a quality-static deflection when the instantaneous value a(t) of the deflection changes in a manner that is synchronous with the control voltage U(t). In the event of a quasi-static deflection, the tuning of the laser may be performed in almost any pattern. For example, zigzag patterns or sinusoidal patterns are possible.

In FIG. 14, the plate 4 is linearly deflected, by the control voltage U1 (cf. FIG. 4), from the value of 0 to the upper maximum value of A and is linearly returned from there to the value of 0. This process starts at the time $t_0$ and ends at the time $t_1$. Subsequently, the plate 4 is linearly deflected, by the control voltage U2 (cf. FIG. 4), from the value of 0 to the lower maximum value of −A and is linearly returned from there to the value of 0. This process is completed at the time $t_2$.

Figure 15:
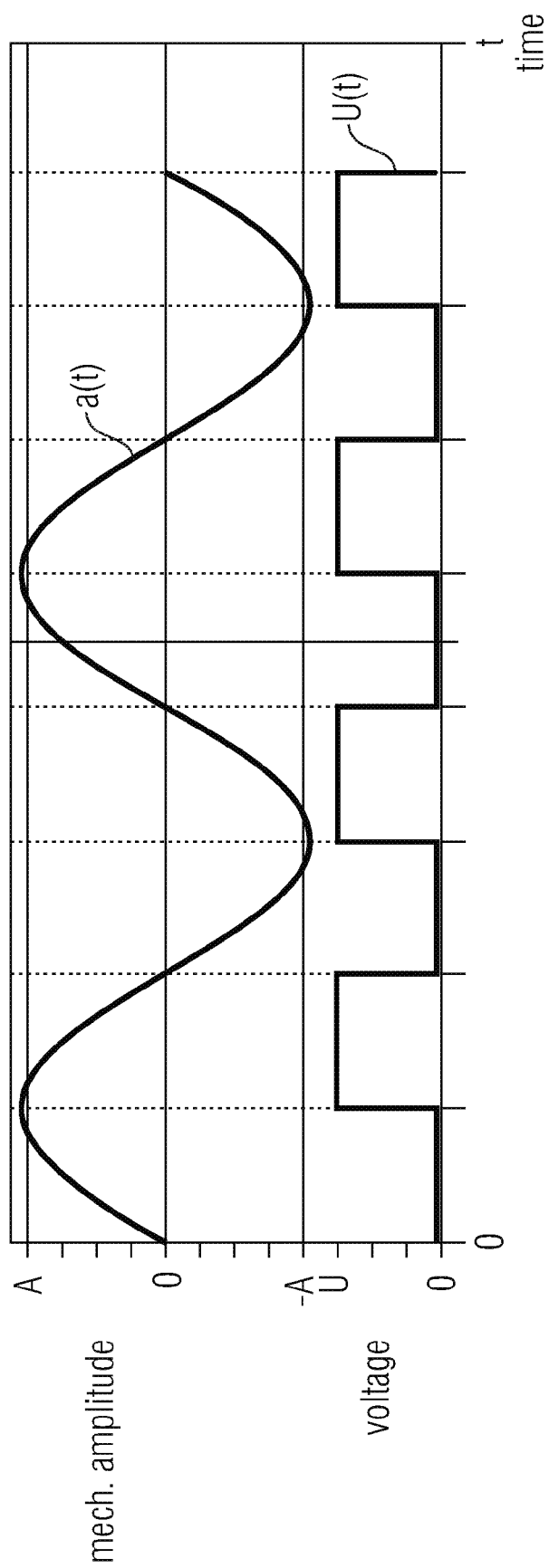
FIG. 15 an outline for illustrating a deflection caused by resonant excitation.

FIG. 15 shows an outline for illustrating a deflection by resonant excitation.

In accordance with an expedient further development of the invention, the electrostatic drive means 6 is configured such that the translational deflection PT of the plate 4 is effected by resonant excitation.

In accordance with an expedient further development of the invention, the electrostatic drive means 6 is configured such that the rotational deflection PR of the plate 4 is effected by resonant excitation.

This is understood to mean that the plate 4 is made to resonate in a rotational and/or translational manner. As a result, large deflections A may be achieved with small forces and/or control voltages U. However, only sinusoidal deflections are possible in this manner.

In FIG. 15, a possible resonant amplitude A as well as the underlying control voltage U are depicted by way of example. Unlike in FIG. 14, no unambiguous association of the voltage u(t) and the amplitude a(t) results here.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

The invention claimed is:

1. Micromechanically produced optical device including:
   a carrier for carrying the micromechanically produced device;
   a diffraction grating for diffracting light;
   a plate for carrying the diffraction grating; and deflection means for deflecting the plate in relation to the carrier, the deflection means comprising bearing means for movably bearing the plate and drive means for moving the plate;

the deflection means being configured for rotational deflection of the plate and for translational deflection of the plate;

wherein the drive means is an electrostatic drive means which includes at least one electrode arrangement and a control means for applying a control voltage to the at least one electrode arrangement;

wherein the bearing means include an intermediate carrier movably connected to the carrier and to the plate, respectively;

wherein the drive means comprises at least one first electrode arrangement, for deflecting the intermediate carrier in relation to the carrier, and at least one second electrode arrangement for deflecting the plate in relation to the intermediate carrier; and wherein the at least one first electrode arrangement for deflecting the intermediate carrier in relation to the carrier comprises at least one electrode that is stationary on the intermediate carrier and at least one electrode that is stationary on the carrier, and wherein the at least one second electrode arrangement for deflecting the plate in relation to the intermediate carrier comprises at least one electrode that is stationary on the intermediate carrier and at least one electrode that is stationary on the plate.

2. Micromechanically produced optical device as claimed in claim 1, wherein the diffraction grating is configured to diffract light within the mid infrared range.

3. Micromechanically produced optical device as claimed in claim 1, wherein the bearing means include elastically deformable bearing elements.

4. Micromechanically produced optical device as claimed in claim 1, wherein the plate has a position sensor associated with it which is configured to measure the rotational deflection and/or to measure the translational deflection of the plate.

5. Micromechanically produced optical device as claimed in claim 1, wherein at least one of the electrode arrangements is an electrode arrangement for translational deflection and for rotational deflection of the plate.

6. Micromechanically produced optical device as claimed in claim 1, wherein the electrostatic drive means includes at least one first electrode arrangement for exclusively translational deflection of the plate and a second electrode arrangement for exclusively rotational deflection of the plate.

7. Micromechanically produced optical device as claimed in claim 1, wherein the electrostatic drive means is configured such that the translational deflection of the plate is performed in a quasi-static manner.

8. Micromechanically produced optical device as claimed in claim 1, wherein the electrostatic drive means is configured such that the rotational deflection of the plate is now performed by resonant excitation.

9. Micromechanically produced optical device as claimed in claim 1, wherein the electrostatic drive means is configured such that the rotational deflection of the plate is performed in a quasi-static manner.

10. Micromechanically produced optical device as claimed in claim 1, wherein the electrostatic drive means is configured such that the translational deflection of the plate is performed by resonant excitation.

11. Micromechanically produced optical device as claimed in claim 1, wherein the bearing means include elastically deformable bearing elements which connect the carrier and the plate.

12. Micromechanically produced optical device as claimed in claim 1, wherein the at least one electrode arrangement includes at least one electrode that is stationary on the carrier and at least one electrode that is stationary on the plate.

13. Micromechanically produced optical device as claimed in claim 1, wherein the bearing means include at least one elastically deformable bearing element connecting the intermediate carrier and the plate, and wherein the bearing means include at least one second elastically deformable bearing element connecting the intermediate carrier and the carrier.

14. Micromechanically produced optical device as claimed in claim 1, wherein the bearing means is configured for translational deflection of the intermediate carrier in relation to the carrier and for rotational deflection of the plate in relation to the intermediate carrier.

15. Micromechanically produced optical device as claimed in claim 1, wherein the bearing means is configured for rotational deflection of the intermediate carrier in relation to the carrier and for translational deflection of the plate in relation to the intermediate carrier.

16. Laser for generating a laser beam having a variable wavelength with a laser resonator determining the wavelength, the laser resonator comprising a micromechanically produced optical device as claimed in any of the previous claims with which the wavelength can be varied.

17. Laser as claimed in claim 16, the laser being a semiconductor laser.

18. Laser as claimed in claim 16, the laser being a quantum cascade laser.

19. Laser as claimed in claim 16, the laser being configured to generate the laser beam within the mid infrared range.

20. Laser as claimed in claim 16, wherein the polarization of the diffraction grating is aimed at maximizing a feedback efficiency into an active medium of the laser.

* * * * *